(12) United States Patent
Morrow et al.

(10) Patent No.: US 9,490,201 B2
(45) Date of Patent: Nov. 8, 2016

(54) METHODS OF FORMING UNDER DEVICE INTERCONNECT STRUCTURES

(71) Applicant: Intel Corporation, Santa Clara, CA (US)

(72) Inventors: Patrick Morrow, Portland, OR (US); Don Nelson, Beaverton, OR (US); M. Clair Webb, Aloha, OR (US); Kimin Jun, Hillsboro, OR (US); Il-Seok Son, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/798,575

(22) Filed: Mar. 13, 2013

(65) Prior Publication Data

US 2014/0264739 A1 Sep. 18, 2014

(51) Int. Cl.
| | |
|---|---|
| *H01L 23/522* | (2006.01) |
| *H01L 21/20* | (2006.01) |
| *H01L 23/00* | (2006.01) |
| *H01L 23/535* | (2006.01) |
| *H01L 21/74* | (2006.01) |
| *H01L 23/528* | (2006.01) |

(52) U.S. Cl.
CPC ......... *H01L 23/522* (2013.01); *H01L 21/2007* (2013.01); *H01L 21/743* (2013.01); *H01L 23/535* (2013.01); *H01L 24/18* (2013.01); *H01L 23/5286* (2013.01)

(58) Field of Classification Search
CPC ............. H01L 21/187; H01L 21/7806; H01L 21/7813; H01L 24/93–24/97
USPC ........................................................ 257/684
See application file for complete search history.

(56) References Cited

U.S. PATENT DOCUMENTS

| | | | | |
|---|---|---|---|---|
| 5,444,602 A | * | 8/1995 | Banerjee et al. | 361/705 |
| 7,800,199 B2 | * | 9/2010 | Oh et al. | 257/532 |
| 2006/0138627 A1 | | 6/2006 | Shaheen et al. | |
| 2007/0111430 A1 | | 5/2007 | Chudzik et al. | |
| 2007/0207592 A1 | * | 9/2007 | Lu et al. | 438/455 |
| 2011/0284818 A1 | | 11/2011 | Avouris et al. | |

FOREIGN PATENT DOCUMENTS

KR 10-2011-0115165 A 10/2011

OTHER PUBLICATIONS

International Search Report and Written Opinion for PCT/US2014/025562 mailed Oct. 14, 2014, International filing date Mar. 13, 2014, 16 pages.
Office Action and Search Report from Taiwan Intellectual Property Office (IPO) for Taiwan Patent Application No. 13109088 dated Aug. 7, 2015 and English translations thereof.
PCT/US2014/025562 PCT Notification Concerning Transmittal of International Preliminary Report on Patentability and International Preliminary Report on Patentability mailed Sep. 24, 2015 and Written Opinion of the International Searching Authority mailed Oct. 14, 2014, International Filing Date Mar. 13, 2014.

* cited by examiner

*Primary Examiner* — Daniel Shook
(74) *Attorney, Agent, or Firm* — Blakely, Sokoloff, Taylor & Zafman LLP (57) ABSTRACT

Methods of forming microelectronic interconnect under device structures are described. Those methods and structures may include forming a device layer in a first substrate, forming at least one routing layer in a second substrate, and then coupling the first substrate with the second substrate, wherein the first substrate is bonded to the second substrate.

50 Claims, 9 Drawing Sheets

METHODS OF FORMING UNDER DEVICE INTERCONNECT STRUCTURES

BACKGROUND OF THE INVENTION

As microelectronic packaging technology advances for higher processor performance, devices dimensions continue to shrink. Interconnect routing within a device has become a limiting factor in designing the building blocks or cells of a particular cell layout design. One of the ways in which a final cell size is limited is by the limitations of designing/placement of the interconnect routing.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as interconnect under device structures, are described. Those methods/structures may include forming a device layer in a first substrate, forming at least one routing layer in a second substrate, and then coupling the first substrate with the second substrate, wherein the first substrate is bonded to the second substrate. The structures of the various embodiments disclosed herein enable reduction in cell size of microelectronic device cell layouts.

FIGS. 1a-1d illustrate cross-sectional views of embodiments of forming microelectronic structures, such as a device with interconnect structures, such as routing layers disposed underneath a device layer. In an embodiment, a device 100, which may comprise a microelectronic die and/or a 3D monolithic die, for example, may comprise a first portion 102 and a second portion 106. The first portion 102 may comprise routing layers/interconnect structures 101, and in general may comprise power routing structures. The first portion 102 may not comprise multiple layers of transistors 106, in an embodiment. In an embodiment, the first 102 portion may comprise capacitors and inductors. The second portion 106 may comprise circuit elements such as transistors, resistors and capacitors. The second portion 106 may comprise interlayer dielectric material 115, 113 and metal layers, such as metal layers 109, 111, for example. In an embodiment, the second layer 106 may comprise a device layer. In an embodiment, a package substrate may be coupled to the device 100. In an embodiment, a heat sink may be coupled to the device.

Figure 1A:
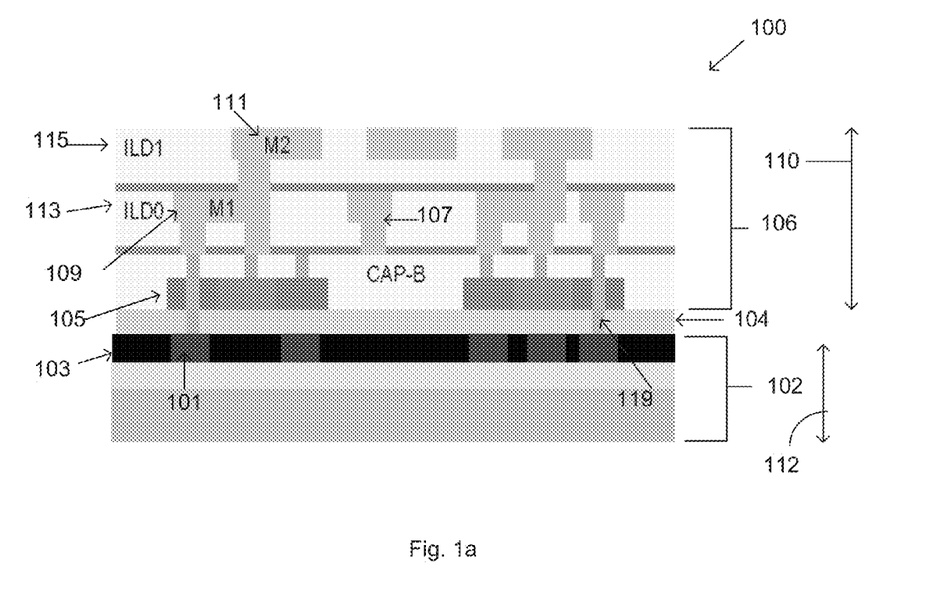
FIGS. 1a-1f represent cross-sectional views of structures according to various embodiments.

The first and second portions 102, 106 of the device 100 may be separated from each other by an intermediate portion 104. In an embodiment, the intermediate portion 104 may comprise a bonded layer, such as a region comprising an oxide to oxide, a metal to metal and a silicon to silicon bonded region. In an embodiment, the intermediate portion 104 may comprise two layers that have been layer transferred to become bonded together. In an embodiment, the second portion 106 may comprise a recrystallized portion, and may comprise an alpha silicon material. In an embodiment, the first portion 102 may comprise a single crystal silicon material or other single crystal semiconductor material. In an embodiment, the first portion 102 may comprise at least one wider signal routing line for long distance wiring resources and lower RC, than routing lines disposed in the second portion 106. In an embodiment, the second portion 106 may comprise a smaller height than a first portion 102 height.

In an embodiment, the interconnect structures 101 may comprise at least one of a power, a ground and signal interconnect structure 101. In an embodiment, the second portion 106 may comprise an alpha silicon material, and the first portion 102 may comprises a non-alpha silicon material. In an embodiment the second portion 106 may comprise circuit elements. In an embodiment, the first portion 102 may comprise a thickness 112 between about 30 microns to about 750 microns, and the second portion 106 may comprise a thickness 110 of about 1 to about 10 microns. In an embodiment, the second portion comprises circuit elements such as transistors, resistors and capacitors, wherein the first portion 102 comprises power routing below the second portion 106. In an embodiment, the first portion 102 comprises no greater than one layer of metal. In an embodiment, the first portion 102 comprises one of a power, ground and I/O routing lines. In an embodiment, the routing lines of the second portion 106 are thinner than the routing lines of the first portion 102, and the thickness of the routing lines disposed in the first portion 102 provide power delivery.

Figure 1B:
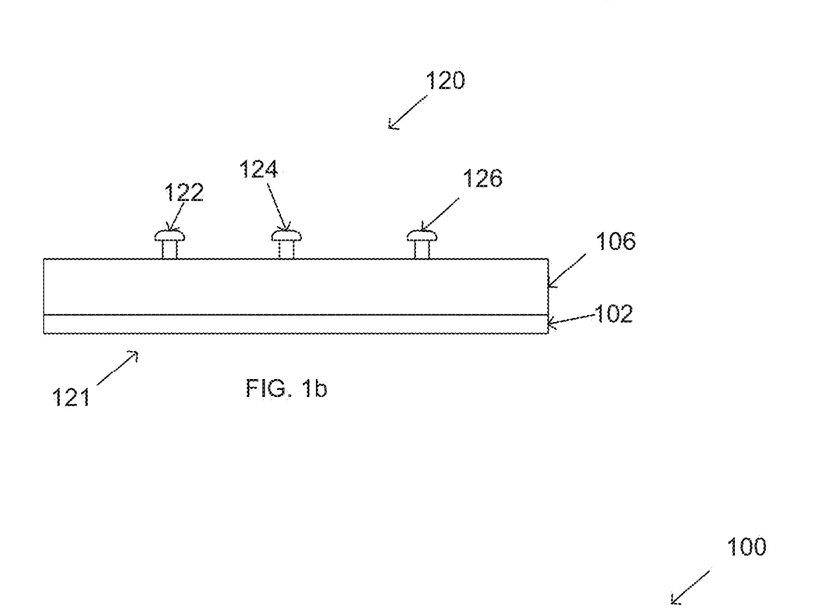

In an embodiment, substantially all power and input/output (I/O) may be delivered through conductive bump interconnects disposed on the second portion 106. In an embodiment, an I/O bump 124, a Vss bump 122 and a Vcc bump 126 may be disposed on a top surface of the second portion 106 (FIG. 1b). In an embodiment, the top surface may comprise a bump side 120, which may comprise a C4 bump side in some cases. In an embodiment, one of Vss and Vcc may be coupled to routing layers disposed in the first portion 102. In an embodiment, only one of the Vss or Vcc may be driven into/conductively coupled to the interconnect structures/routing layers 101 that are disposed in the first portion 102 underneath the second portion 106, while the other of the Vss or Vcc is not coupled with the routing layers. In an embodiment, a heat sink side 121 may be disposed opposite the bump side 120.

Figure 1C:
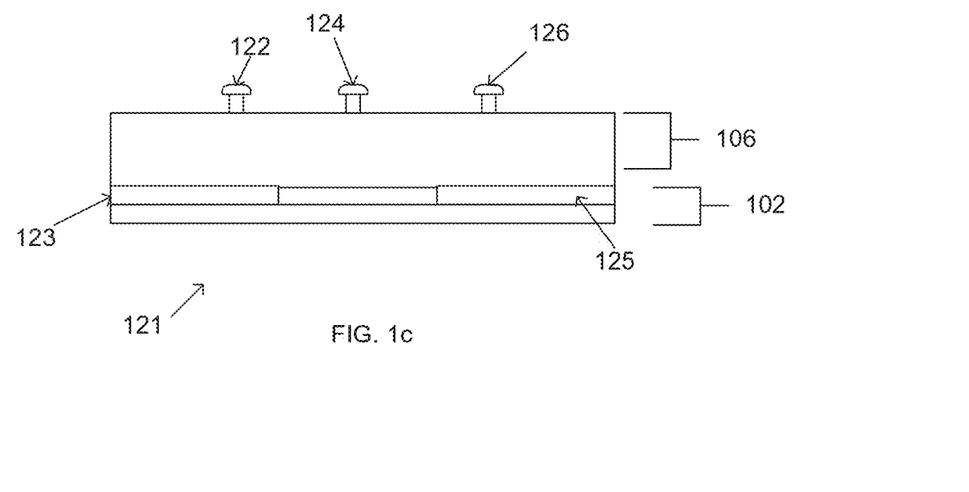
Figure 1D:
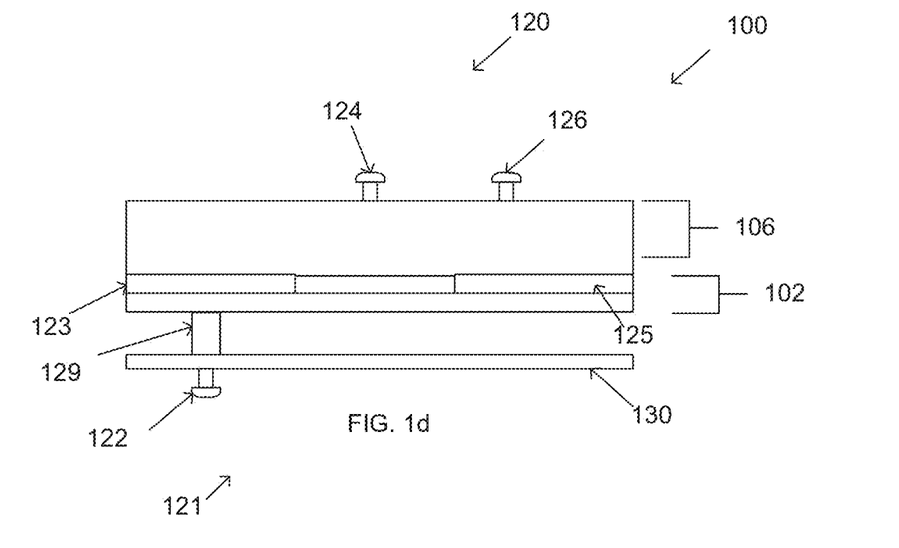

In another embodiment, the second portion 106 may comprise substantially all power and I/O delivered through conductive interconnects/bumps on the front portion 106. Both the Vss 123 and a Vcc 125 may be driven to/coupled with the metal layers/routing interconnect structures 123, 125 disposed in the first portion 102 (FIG. 1c). In an embodiment, a mimcap (which may comprise a parallel plate capacitor with two electrical plates and a dielectric material between them, in an embodiment) may be disposed in the first portion 102. Inductors may also be included in the first portion 102, which may include spiral inductors, inductors comprising magnetic materials, as well as passive structures in general being disposed underneath the device layer 102. In another embodiment, I/O and Vcc may be delivered through the second portion 106, which may comprise a package side (FIG. 1d). Vss 126 may be driven/coupled with interconnects 123 to the routing layers disposed in the first portion 102. Vss, which may be a ground Vss, may be delivered by bumps/interconnects 129 that contact a ground heatsink 130. Alternatively, Vss and Vcc may be interchanged, and the heatsink 130 may then be at Vcc potential instead of ground.

Figure 1E:
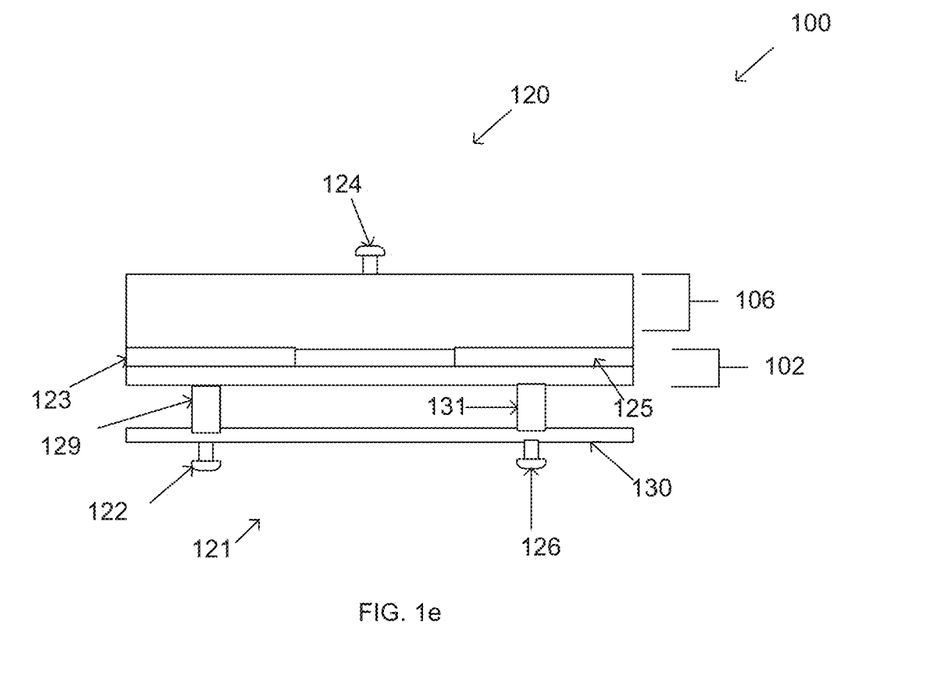
Figure 1F:
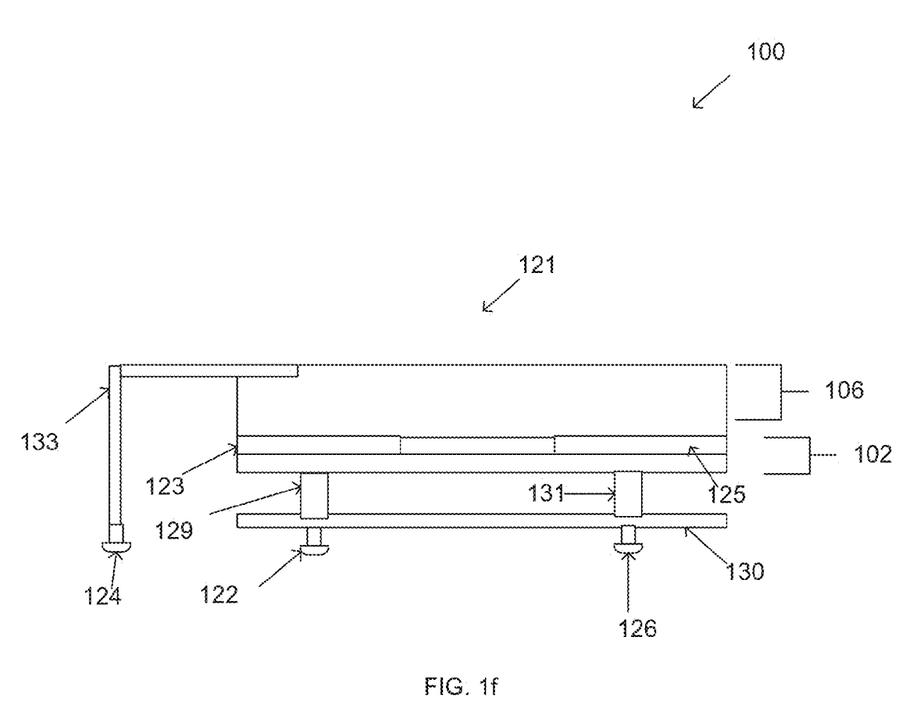

In another embodiment, I/O signals may be delivered through bumps on one side of the device 100, and Vcc and Vss power may be delivered through bumps on the other side of the device 100 (FIG. 1e). For example, the I/O bump 124 may be disposed on the second portion 106, and the Vcc and the Vss 126, 122 may be disposed on the first portion 102. The power may be delivered by bumps on the first substrate 102. In another embodiment, bumps on the first portion 102 may deliver I/O, Vss and Vcc 124, 122, 126 (FIG. 1f). No signals may be delivered at the side opposite the I/O, Vss and Vcc (which may comprise the second portion side), and the opposite side may comprise a heat sink. In an embodiment, the I/O may be coupled to the first portion by a conductive structure 133, and the second portion 106 may comprise the heat sink side 121.

Figure 2A:
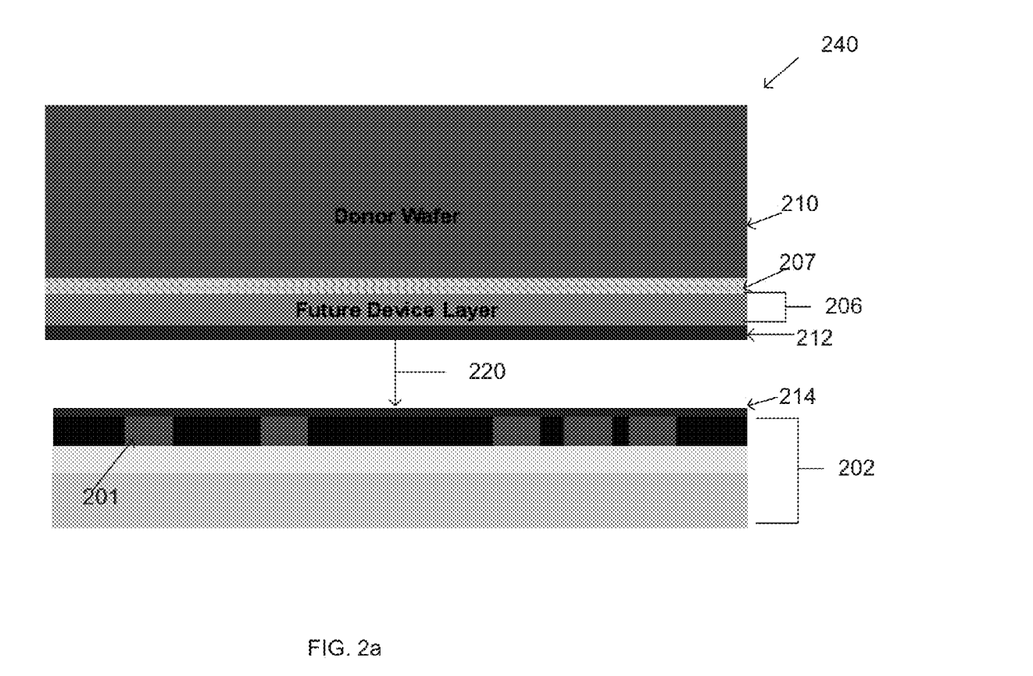
FIGS. 2a-2b represents cross sectional views of structures according to embodiments.
Figure 2B:
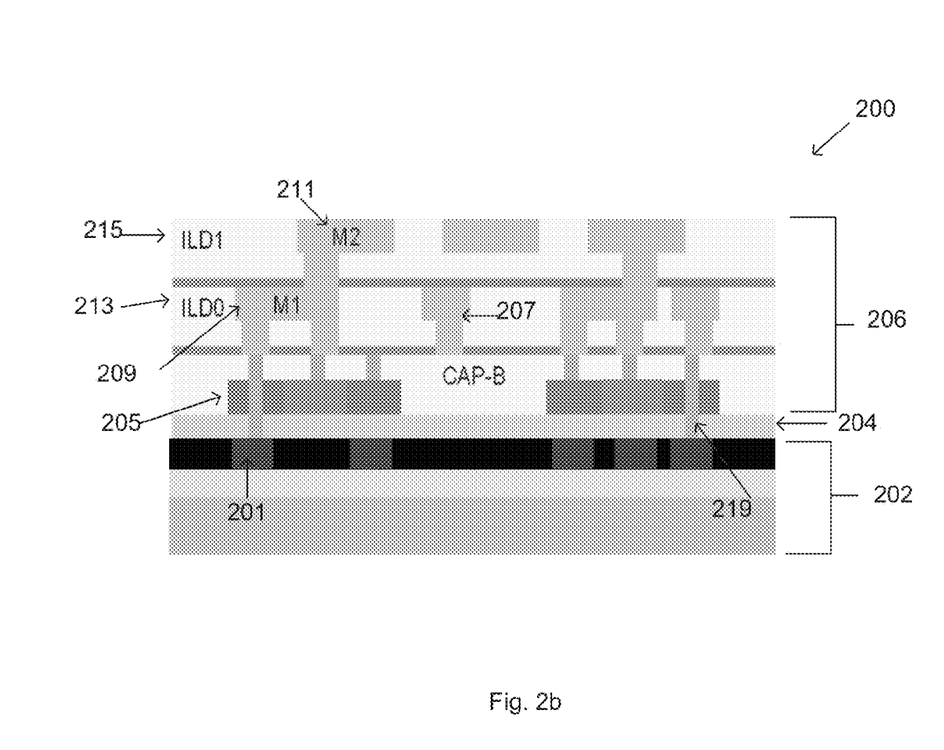

FIGS. 2a-2b depict a method of forming a device comprising routing interconnect structures that are located below the device. In an embodiment, a first substrate 202 may comprise conductive interconnect lines 201, such as routing lines 201, for example. In an embodiment, the first substrate 202 may comprise a first bonding layer 214. In an embodiment, the first substrate 202 may comprise any suitable material(s) with which to form interconnect/routing structures 201. In an embodiment, the first substrate 202 may comprise a silicon on insulator material, a non-silicon material, a single crystal silicon material and a polysilicon material. A second substrate 240 may comprise a device layer 206, a cleaving layer 207, which may comprise an implanted layer, for example, a donor portion 210, and a second bonding layer 212. In an embodiment, the second substrate 240 may comprise a single crystal silicon material.

The device 206 layer may comprise circuit elements, such as capacitors, transistors and resistors, for example. In other embodiments, the device layer 206 may not comprise circuit elements, but may comprise a material that may be utilized to form circuit elements subsequently therein. A transfer layer process 220 may be utilized wherein the first bonding layer 214 may be bonded to the second bonding layer 212.

In an embodiment, the second bonding layer 212 may comprise any type of material that may be bonded to the first bonding layer 214 of the first substrate 202. In an embodiment, the bonding layers 212, 214 may comprise a dielectric material, such as a chemical vapor deposition (CVD) dielectric material or a thermally grown oxide or nitride material. In an embodiment, the layer transfer process 220, may comprise an oxide to oxide or a metal to metal bonding process, or a silicon to silicon bonding process, for example, which may be employed to bond the first substrate 202 to the device layer 206. In an embodiment, the bonding may comprise hydrogen bonding between the first and second bonding layers.

In an embodiment, the second bonding layer 212 may be directly disposed on the device layer 206, and the device layer 206 may be directly disposed on the first bonding layer 214 after layer transfer process. The donor portion 210 may be cleaved at the cleaving layer 207 to form the interconnect under device structure 200, wherein the interconnect/routing layers 201 are disposed in the first substrate 202 (FIG. 2b). In an embodiment, the interconnect/routing layers 201 of the first substrate 202 are separated from the device layer by intermediate layer/region 204, wherein the interconnect/routing layers 201 may be viewed as being disposed above or below the device features of the second substrate 206, depending upon the perspective.

In an embodiment, the cleaving layer 207, which may comprise an ion implanted layer, such as a hydrogen or helium ion implanted layer, in some cases, may be cleaved/separated from the device layer 206, and the donor portion 210 may be removed from the second substrate 240. The donor portion 210 may also be removed using porous silicon or other mechanically weak interface layers to facilitate removal, and/or an etch back process may be employed. Any suitable process which permits the device layer 206 to be transferred may be utilized. In an embodiment, the first and second bonding layers 212, 214 may comprise an intermediate layer 204, which may comprise a thickness of between about 10 nm to about 200 nm in some cases, and which comprises a layer/region that is disposed between the device layer 206 and the first substrate 202, wherein the region/layer 204 comprises two layers that have been bonded together utilizing a layer transfer process.

In an embodiment, circuit elements may be formed subsequent to the bonding of the device layer 206 to the first substrate 200, and the removal of the donor portion 210. The circuitry elements may comprise logic circuitry for use in a processor die, for example, such as transistor structures 205, or any other suitable device circuitry according to the particular application. Metallization layers 209, 211 and insulative material 213, 215 may be included in the device layer 206, as well as conductive contacts/bumps that may couple metal layers/interconnects to external devices. In an embodiment, the bumps may comprise copper. In an embodiment, conductive interconnects 219 may be formed to electrically and physically couple circuit elements, such as transistors 205 for example, to the routing lines 201 of the first substrate 201.

Figure 3:
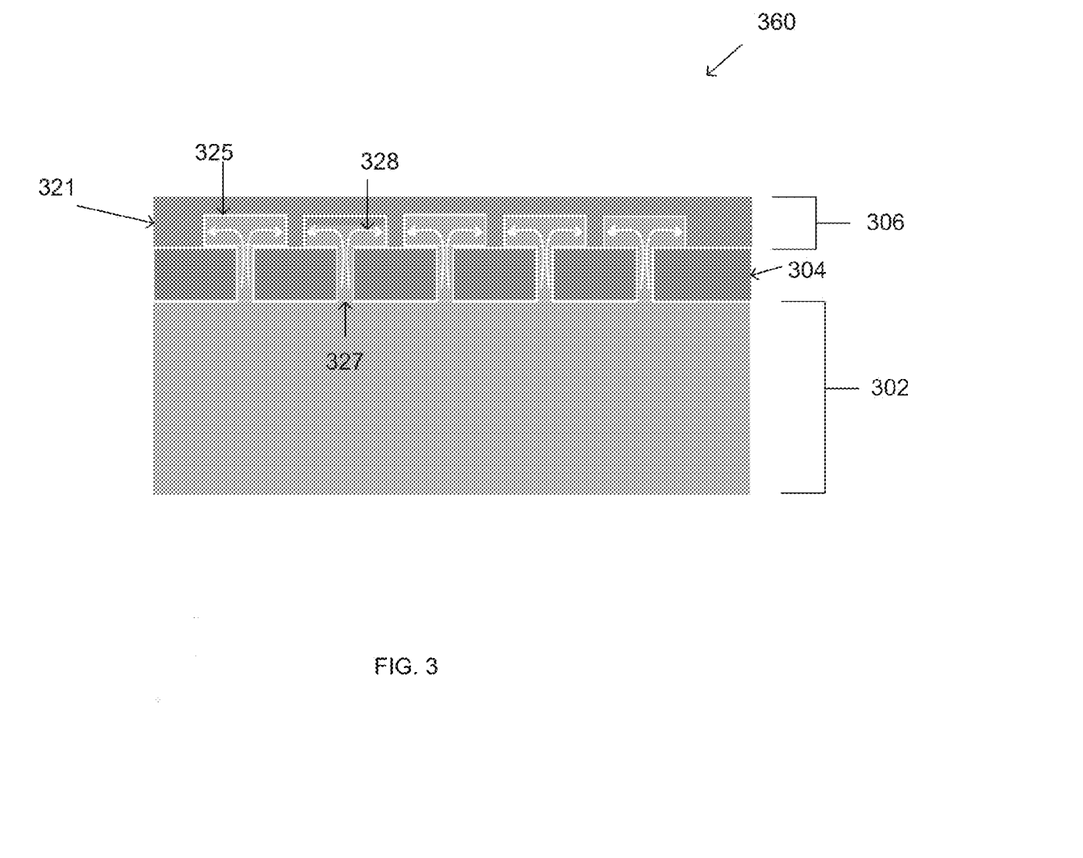
FIG. 3 represents cross sectional views of a structure according to embodiments.

FIG. 3 depicts another embodiment of an interconnect under device structure 360. A first portion 302 may comprise routing layers/interconnect structures, similar to those of FIG. 2b for example. The first portion 302 may not comprise other types of circuit elements such as layers of transistors/devices, for example. A second portion 306 may initially comprise an amorphous silicon material 321. The second portion 306 comprises oxide structures 304 that may comprise openings 327. The openings 327 may allow for a recrystallizing process 328 wherein a single crystal area 325 may be seeded from the underlying material from the first portion 302 material, to form a device layer 306 within the second portion 306.

Thus, the second portion 306 may be grown to a desired thickness, and may be utilized to subsequently form circuit elements such as transistor, capacitors, etc, and may be analogous to the device layer 206 of FIG. 2b, for example. The oxide layer 304 may comprise an intermediate layer 304 between the first portion 302 and the second portion 306 of the interconnect under device structure 360, in an embodiment. In an embodiment, portions of the seeds 325 may comprise a portion of the intermediate layer 304.

The embodiments of the interconnect under device structures included herein may be coupled with various package structures, for example, and may comprise any suitable type of package structures capable of providing electrical communications between a microelectronic device, such as a die, and a next-level component to which the package structures may be coupled (e.g., a circuit board). In another embodiment, the package structures herein may comprise any suitable type of package structures capable of providing electrical communication between a die and an upper integrated circuit (IC) package coupled with a lower IC package.

A device in the various Figures herein may comprise a silicon logic die or a memory die, for example, or any type of suitable microelectronic device/die, and may be disposed on a back side or on a front side of a package structure. In some embodiments the package structure may further comprise a plurality of dies, which may be stacked upon one another, depending upon the particular embodiment. In some cases the die(s) may be located/attached/embedded on either the front side, back side or on/in some combination of the front and back sides of the package structures. In an embodiment, the die(s) may be partially or fully embedded in the package structures of the embodiments.

The various embodiments of the interconnect under device structures included herein promote cell size reduction by at least 40 percent in some cases. By locating routing layers below the device layer and cell layout, the cell footprint may be allowed to shrink. Power ground and signal routing layers may be moved below the device elements, such as below transistors and the like. A single crystal silicon may be utilized for device fabrication by employing a layer transfer process.

Figure 4:
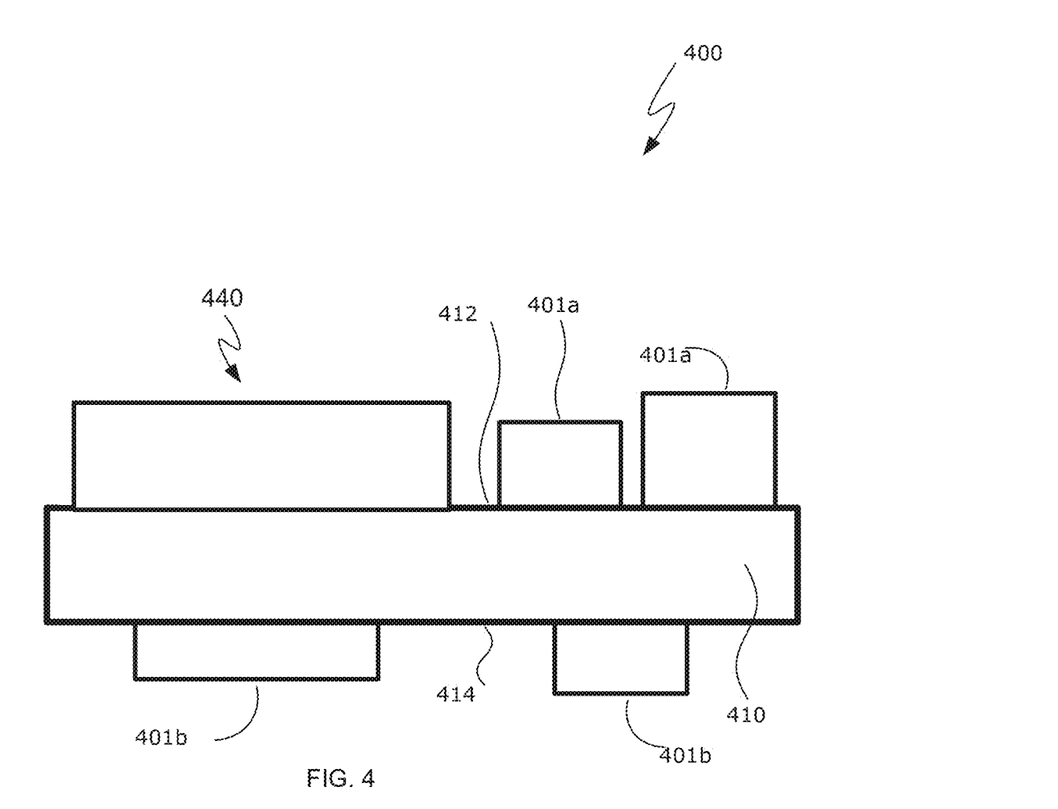
FIG. 4 represents a cross-sectional view of a structure according to embodiments.

Turning now to FIG. 4, illustrated is an embodiment of a computing system 400. The system 400 includes a number of components disposed on a mainboard 410 or other circuit board. Mainboard 410 includes a first side 412 and an opposing second side 414, and various components may be disposed on either one or both of the first and second sides 412, 414. In the illustrated embodiment, the computing system 400 includes a package structure 440 (which may be similar to the package structure 120 of FIG. 1e, for example) disposed on the mainboard's first side 412, wherein the package structure 440 may comprise any of the conductive interconnect structure embodiments described herein.

System 400 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 410 may comprise any suitable type of circuit board or other substrate capable of providing electrical communication between one or more of the various components disposed on the board. In one embodiment, for example, the mainboard 410 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 410. However, it should be understood that the disclosed embodiments are not limited to the above-described PCB and, further, that mainboard 410 may comprise any other suitable substrate.

In addition to the package structure 440, one or more additional components may be disposed on either one or both sides 412, 414 of the mainboard 410. By way of example, as shown in the figures, components 401a may be disposed on the first side 412 of the mainboard 410, and components 401b may be disposed on the mainboard's opposing side 414. Additional components that may be disposed on the mainboard 410 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 400 includes a radiation shield. In a further embodiment, the computing system 400 includes a cooling solution. In yet another embodiment, the computing system 400 includes an antenna. In yet a further embodiment, the assembly 400 may be disposed within a housing or case. Where the mainboard 410 is disposed within a housing, some of the components of computer system 400—e.g., a user interface device, such as a display or keypad, and/or a power supply, such as a battery—may be electrically coupled with the mainboard 410 (and/or a component disposed on this board) but may be mechanically coupled with the housing.

Figure 5:
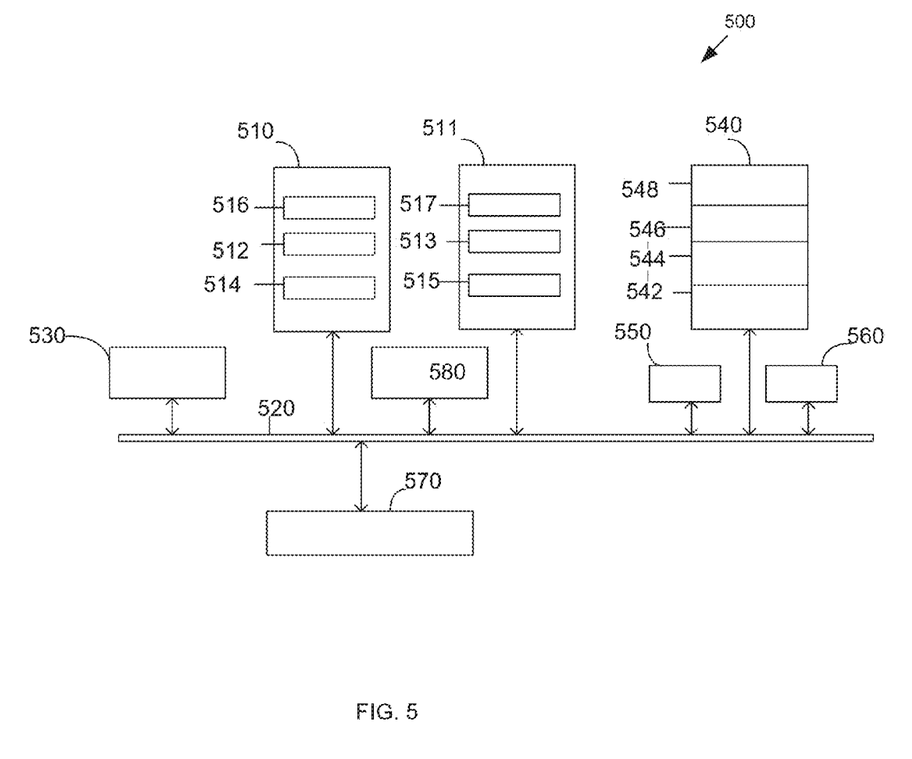
FIG. 5 represents a schematic of a system according to embodiments.

FIG. 5 is a schematic of a computer system 500 according to an embodiment. The computer system 500 (also referred to as the electronic system 500) as depicted can embody/include a package structure/conductive interconnect material that includes any of the several disclosed embodiments and their equivalents as set forth in this disclosure. The computer system 500 may be a mobile device such as a netbook computer. The computer system 500 may be a mobile device such as a wireless smart phone. The computer system 500 may be a desktop computer. The computer system 500 may be a hand-held reader. The computer system 500 may be integral to an automobile. The computer system 500 may be integral to a television.

In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically, communicatively coupled to the system bus 520 and includes any circuit, or combination of circuits according to an embodiment, including the package/device of the various embodiments included herein. In an embodiment, the integrated circuit 510 includes a processor 512 that can include any type of packaging structures according to the embodiments herein. As used herein, the processor 512 may mean any type of circuit such as, but not limited to, a microprocessor, a microcontroller, a graphics processor, a digital signal processor, or another processor. In an embodiment, the processor 512 includes any of the embodiments of the package structures disclosed herein. In an embodiment, SRAM embodiments are found in memory caches of the processor.

Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems. In an embodiment, the processor 512 includes on-die memory 516 such as static random-access memory (SRAM). In an embodiment, the processor 512 includes embedded on-die memory 516 such as embedded dynamic random-access memory (eDRAM).

In an embodiment, the integrated circuit 510 is complemented with a subsequent integrated circuit 511. In an embodiment, the dual integrated circuit 511 includes embedded on-die memory 517 such as eDRAM. The dual integrated circuit 511 includes an RFIC dual processor 513 and a dual communications circuit 515 and dual on-die memory 517 such as SRAM. The dual communications circuit 515 may be configured for RF processing.

At least one passive device 580 is coupled to the subsequent integrated circuit 511. In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548. In an embodiment, the electronic system 500 also includes a display device 550, and an audio output 560. In an embodiment, the electronic system 500 includes an input device such as a controller 570 that may be a keyboard, mouse, touch pad, keypad, trackball, game controller, microphone, voice-recognition device, or any other input device that inputs information into the electronic system 500. In an embodiment, an input device 570 includes a camera. In an embodiment, an input device 570 includes a digital sound recorder. In an embodiment, an input device 570 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a structure comprising:
forming at least one routing layer in a first substrate having a first bonding layer comprising a first semiconductor material wherein the first substrate does not include a device layer;
forming a device layer in a second substrate having a second bonding layer comprising a second semiconductor material; and
coupling the first substrate with the second substrate, wherein the first semiconductor material of the first substrate is bonded to the second semiconductor material of the second substrate.

2. The method of claim 1 further comprising wherein the routing layer comprises at least one of a power, a ground or signal routing layer.

3. The method of claim 1 further comprising wherein the at least one routing layer comprises one of a Vcc, a Vss, and an I/O delivery structure.

4. The method of claim 1 further comprising wherein the first substrate and second substrate are layer transferred and bonded to one another.

5. The method of claim 4 further comprising wherein a first bonding layer disposed on the first substrate and a second bonding layer disposed on the second substrate are directly bonded together.

6. The method of claim 1 further comprising wherein the second substrate comprises substantially all power and I/O conductive interconnects, and wherein one of a Vss and a Vcc are coupled to the at least one routing layer disposed in the first substrate.

7. The method of claim 1 further comprising wherein the second substrate comprises substantially all power and I/O bumps, and wherein both Vss and Vcc are coupled to the routing layers in the first substrate.

8. The method of claim 7 further comprising wherein a mimcap is formed in the first substrate.

9. The method of claim 1 further comprising wherein the second substrate comprises I/O and Vcc bumps, and wherein Vss is coupled to the at least one routing layer in the first substrate, wherein Vss is delivered by bumps that contact a grounded heat sink.

10. The method of claim 1 further comprising wherein the second substrate comprises I/O and Vss bumps, and wherein Vcc is coupled to the at least one routing layer disposed in the first substrate, wherein Vcc is delivered by bumps that contact a grounded heat sink.

11. The method of claim 1 further comprising wherein the second substrate comprises an I/O bump, and wherein Vcc and Vss are coupled to the at least one routing layer disposed in the first substrate, wherein power is delivered by bumps on the second substrate.

12. The method of claim 1 further comprising wherein the first substrate comprises bumps delivering I/O, Vss and Vcc, and wherein no signals are delivered on the second substrate.

13. The method of claim 12 further comprising wherein a heat sink is coupled to the first substrate.

14. The method of claim 1 wherein the first substrate comprises at least one wider signal routing line for long distance wiring resource and lower RC than routing lines of the second substrate.

15. The method of claim 1 wherein the second substrate comprises a smaller thickness than a thickness of the first substrate.

16. The method of claim 1 wherein the second substrate comprises a single crystal silicon substrate.

17. The method of claim 1 wherein the routing lines of the second substrate are thinner than the routing lines of the first substrate, and wherein the thickness of the routing lines disposed in the first substrate provide power delivery.

18. The method of claim 1 wherein the structure comprises a device, and wherein a package substrate is coupled to the device.

19. The method of claim 18 wherein a heat sink is coupled to one of the first and the second substrate.

20. A method of forming a package structure comprising:
forming a first bonding layer comprising a first semiconductor material on a first substrate, wherein the first substrate comprises at least one routing layer and does not include a device layer;
forming a second bonding layer comprising a second semiconductor material on a device layer of a second substrate; and
bonding the first bonding layer with the second bonding layer.

21. The method of claim 20 further comprising wherein a donor portion of the second substrate is cleaved from the second substrate.

22. The method of claim 20 further comprising wherein circuit elements are formed in the device layer subsequent to bonding the first bonding layer to the second bonding layer.

23. The method of claim 20 further comprising wherein the first substrate is bonded to the second substrate by using a layer transfer process.

24. The method of claim 20 further comprising wherein the first substrate comprise no greater than one layer of metal routing lines.

25. The method of claim 20 further comprising wherein the first bonding layer and the second bonding layer comprise silicon.

26. A structure comprising:
at least one routing layer disposed in a first substrate, wherein the first substrate does not include a device layer;
a device layer disposed in a second substrate; and
a bonding layer coupling the first substrate with the second substrate wherein the bonding layer comprises a first semiconductor material bonded to a second semiconductor material.

27. The structure of claim 26 further comprising wherein the at least one routing layer comprises at least one of a power, a ground or a signal routing layer.

28. The structure of claim 26 further comprising wherein the at least one routing layer is conductively coupled to one of Vcc, Vss and I/O disposed in the device layer.

29. The structure of claim 26 further comprising wherein the device layer comprises a different substrate material than a material of the first substrate.

30. The structure of claim 26 further comprising wherein a first bonding layer disposed on the first substrate and a second bonding layer disposed on the second substrate are directly bonded together.

31. The structure of claim 26 further comprising wherein the second substrate comprises substantially all power and I/O conductive interconnects, and wherein one of Vss and Vcc are conductively coupled to routing layers disposed in the first substrate.

32. The structure of claim 26 further comprising wherein the second substrate comprises substantially all power and I/O conductive interconnects, and wherein both Vss and Vcc are conductively coupled to routing layers disposed in the first substrate.

33. The structure of claim 32 further comprising wherein a mimcap is disposed in the first substrate.

34. The structure of claim 26 further comprising wherein the second substrate comprises I/O and Vcc, and wherein Vss is conductively coupled to routing layers disposed in the first substrate, wherein Vss is delivered by bumps that contact a grounded heat sink.

35. The structure of claim 26 further comprising wherein the second substrate comprises I/O and Vss, and wherein Vcc is conductively coupled to routing layers disposed in the first substrate, wherein Vcc is delivered by bumps that contact a grounded heat sink.

36. The structure of claim 26 further comprising wherein the second substrate comprises I/O, and wherein Vcc and Vss are conductively coupled to routing layers disposed in the first substrate, wherein power is delivered by bumps on the first substrate.

37. The structure of claim 26 further comprising wherein the first substrate comprises bumps capable of delivering I/O, Vss and Vcc, and wherein the second substrate comprises no signal lines.

38. The method of claim 37 further comprising wherein the second substrate comprises a heat sink.

39. The method of claim 26 wherein the first substrate comprises at least one wider signal routing line for long distance wiring and lower RC.

40. The structure of claim 26 wherein the second substrate comprises a thickness that is less than a thickness of the first substrate.

41. The structure of claim 26 wherein the second substrate comprises a single crystal silicon substrate.

42. The structure of claim 26 wherein the routing lines of the second substrate are thinner than the routing lines of the first substrate, and wherein the routing lines disposed in the first substrate are capable of providing power delivery.

43. The structure of claim 26 wherein the structure comprises a device, and wherein a package substrate is coupled to the device.

44. The structure of claim 43 further comprising wherein the package substrate comprises a BBUL package substrate.

45. The structure of claim 26 wherein a heat sink is coupled to one of the first or second substrate.

46. The structure of claim 26 further comprising wherein the first substrate comprise no greater than one layer of metal routing lines.

47. The structure of claim 26 further comprising wherein the first bonding layer and the second bonding layer comprise silicon.

48. The structure of claim 26 wherein the device layer further comprises at least one of a CPU die and a memory die.

49. The structure of claim 26 further comprising a system comprising:
a bus communicatively coupled to the structure; and
an eDRAM communicatively coupled to the bus.

50. The structure of claim 26 further comprising wherein the structure comprises a monolithic 3D device.

* * * * *